(12) United States Patent
Mori

(10) Patent No.: US 12,494,759 B2
(45) Date of Patent: Dec. 9, 2025

(54) MULTILAYER ELECTRONIC COMPONENT

(71) Applicant: TDK CORPORATION, Tokyo (JP)

(72) Inventor: Naoyuki Mori, Tokyo (JP)

(73) Assignee: TDK CORPORATION, Tokyo (JP)

(*) Notice: Subject to any disclaimer, the term of this patent is extended or adjusted under 35 U.S.C. 154(b) by 217 days.

(21) Appl. No.: 18/167,141

(22) Filed: Feb. 10, 2023

(65) Prior Publication Data

US 2023/0275552 A1    Aug. 31, 2023

(30) Foreign Application Priority Data

Feb. 28, 2022 (JP) ................. 2022-029427

(51) Int. Cl.
*H03H 7/01* (2006.01)
*H03H 7/46* (2006.01)
*H03H 1/00* (2006.01)

(52) U.S. Cl.
CPC ........ *H03H 7/0115* (2013.01); *H03H 7/1741* (2013.01); *H03H 7/46* (2013.01); *H03H 7/463* (2013.01); *H03H 2001/0085* (2013.01)

(58) Field of Classification Search
CPC ......... H03H 2001/0085; H03H 7/0115; H03H 7/46; H03H 7/463
USPC .................................. 333/175, 185
See application file for complete search history.

(56) References Cited

U.S. PATENT DOCUMENTS

| | | | |
|---|---|---|---|
| 6,147,571 A | 11/2000 | Kitazawa et al. | |
| 9,413,413 B2 | 8/2016 | Murase et al. | |
| 2003/0080830 A1* | 5/2003 | Matsumura | H03H 7/0115 333/185 |
| 2006/0192637 A1 | 8/2006 | Urano et al. | |
| 2007/0013462 A1* | 1/2007 | Fan | H03H 7/1775 333/185 |
| 2010/0123526 A1* | 5/2010 | Okada | H03H 7/42 333/5 |
| 2013/0200958 A1 | 8/2013 | Satake | |
| 2017/0110240 A1 | 4/2017 | Masuda et al. | |
| 2018/0248537 A1 | 8/2018 | Muranaka | |
| 2019/0267339 A1 | 8/2019 | Murase | |
| 2020/0203801 A1 | 6/2020 | Im et al. | |
| 2021/0126609 A1* | 4/2021 | Taniguchi | H03H 7/0115 |

(Continued)

FOREIGN PATENT DOCUMENTS

| | | | |
|---|---|---|---|
| JP | 2002-135005 A | 5/2002 | |
| JP | 2002-271109 A | 9/2002 | |

(Continued)

OTHER PUBLICATIONS

English translation of May 20, 2025 Office Action issued in Japanese Patent Application No. 2022-029427.

(Continued)

*Primary Examiner* — Rakesh B Patel
(74) *Attorney, Agent, or Firm* — Oliff PLC

(57) ABSTRACT

An electronic component includes: a stack that includes a bottom surface and a top surface; a first ground conductor layer and a second ground conductor layer that are each integrated with the stack and connected to the ground; a first filter that is arranged between the bottom surface and the first ground conductor layer in the stack; and a second filter that is arranged between the bottom surface and the second ground conductor layer in the stack.

8 Claims, 11 Drawing Sheets

(56) References Cited

U.S. PATENT DOCUMENTS

2023/0077358 A1\* 3/2023 Sato .................... H03H 7/0115
439/417

FOREIGN PATENT DOCUMENTS

| JP | 2004-312065 A | 11/2004 |
| JP | 2010-124018 A | 6/2010 |

OTHER PUBLICATIONS

Sep. 9, 2025 Office Action issued in Japanese Patent Application No. 2022-029427.

\* cited by examiner

MULTILAYER ELECTRONIC COMPONENT

CROSS REFERENCE TO RELATED APPLICATIONS

This application claims the benefit of Japanese Priority Patent Application No. 2022-029427 filed on Feb. 28, 2022, the entire contents of which are incorporated herein by reference.

BACKGROUND OF THE INVENTION

1. Field of the Invention

The present invention relates to a multilayer electronic component including two filters.

2. Description of the Related Art

Recently, compact mobile communication apparatuses typified by cellular phones and smartphones have achieved greater functionality and further miniaturization, and the packing densities of electronic components have increased accordingly. As a result, spacings between a plurality of electronic components mounted on a mount substrate have been reduced in the compact mobile communication apparatuses.

As the spacings between the electronic components are reduced, electromagnetic interference is more likely to occur between the electronic components. For example, US 2019/0267339 A1 and US 2017/0110240 A1 disclose techniques for suppressing electromagnetic interference between a plurality of electronic components. US 2019/0267339 A1 describes a high-frequency module in which a shielding member is formed on a resin sealing therein active components, to prevent noise from entering the inside of the high-frequency module. US 2017/0110240 A1 describes an electronic component in which a shield electrode is provided on a top surface and four side surfaces of a stack, to prevent noise from entering the inside of the electronic component and also prevent noise from radiating outside the electronic component.

Compact mobile communication apparatuses are often configured to include an antenna that is used by both the system and a plurality of applications of different used frequency bands and use a branching filter to separate a plurality of signals for this antenna to transmit and receive.

A branching filter for separating from each other a first signal of a frequency within a first frequency band and a second signal of a frequency within a second frequency band higher than the first frequency band typically includes a common port, a first signal port, a second signal port, a first filter provided in a first signal path leading from the common port to the first signal port, and a second filter provided in a second signal path leading from the common port to the second signal port.

A compact mobile communication apparatus using the branching filter is required to suppress electromagnetic interference between the branching filter and other electronic components. However, when either of the techniques described in US 2019/0267339 A1 and US 2017/0110240 A1 is applied to the branching filter, a problem arises that isolation between the first filter and the second filter is degraded.

The foregoing problem is not limited to branching filters and applies to multilayer electronic components in general each of which includes two filters.

SUMMARY OF THE INVENTION

An object of the present invention is to provide a multilayer electronic component that includes two filters and that can prevent the occurrence of electromagnetic malfunctions due to high density packaging while suppressing degradation of isolation between the two filters.

A multilayer electronic component of the present invention includes: a stack that includes a plurality of dielectric layers stacked together and includes a first surface facing a mounted body and a second surface opposite to the first surface; a first ground conductor layer and a second ground conductor layer that are each integrated with the stack and connected to ground; a first filter that is arranged between the first surface and the first ground conductor layer in the stack; and a second filter that is arranged between the first surface and the second ground conductor layer in the stack.

In the multilayer electronic component of the present invention, the first ground conductor layer and the second ground conductor layer may be arranged at positions closer to the second surface than the first surface in the stack.

In the multilayer electronic component of the present invention, the first ground conductor layer and the second ground conductor layer may be separated from each other.

The multilayer electronic component of the present invention may further include: a plurality of first through holes that electrically connect the first ground conductor layer and the ground; and a plurality of second through holes that electrically connect the second ground conductor layer and the ground.

The multilayer electronic component of the present invention may further include a third ground conductor layer that is arranged at a position closer to the first surface than the second surface in the stack and is connected to the ground. In this case, the first ground conductor layer and the second ground conductor layer may electrically be connected to each other through the third ground conductor layer.

The multilayer electronic component of the present invention may further include a terminal that is arranged on the first surface and is connected to the ground. In this case, the first ground conductor layer and the second ground conductor layer may each be electrically connected to the terminal.

In the multilayer electronic component of the present invention, the first ground conductor layer may overlap a plurality of components of the first filter that are located on a side of the second surface with respect to middle of a stacking direction of the plurality of dielectric layers in the stack, when seen from a direction parallel to the stacking direction of the plurality of dielectric layers. The second ground conductor layer may overlap a plurality of components of the second filter that are located on the side of the second surface with respect to the middle of the stacking direction of the plurality of dielectric layers in the stack, when seen from the direction parallel to the stacking direction of the plurality of dielectric layers.

In the multilayer electronic component of the present invention, the first filter and the second filter may each be an LC filter constituted by using at least one inductor and at least one capacitor. In this case, the first ground conductor layer may overlap the at least one inductor constituting the first filter, when seen from a direction parallel to a stacking direction of the plurality of dielectric layers. The second ground conductor layer may overlap the at least one inductor constituting the second filter, when seen from the direction parallel to the stacking direction of the plurality of dielectric layers.

In the multilayer electronic component of the present invention, the first filter may selectively pass a signal of a frequency within a first passband. The second filter may selectively pass a signal of a frequency within a second passband different from the first passband.

In the multilayer electronic component of the present invention, the first filter is arranged between the first surface and the first ground conductor layer in the stack, and the second filter is arranged between the first surface and the second ground conductor layer in the stack. According to the present invention, a multilayer electronic component that can suppress degradation of isolation between two filters while preventing the occurrence of electromagnetic malfunctions due to high density packaging can be provided.

Other and further objects, features, and advantages of the present invention will appear more fully from the following description.

DETAILED DESCRIPTION OF THE PREFERRED EMBODIMENTS

Figure 1:
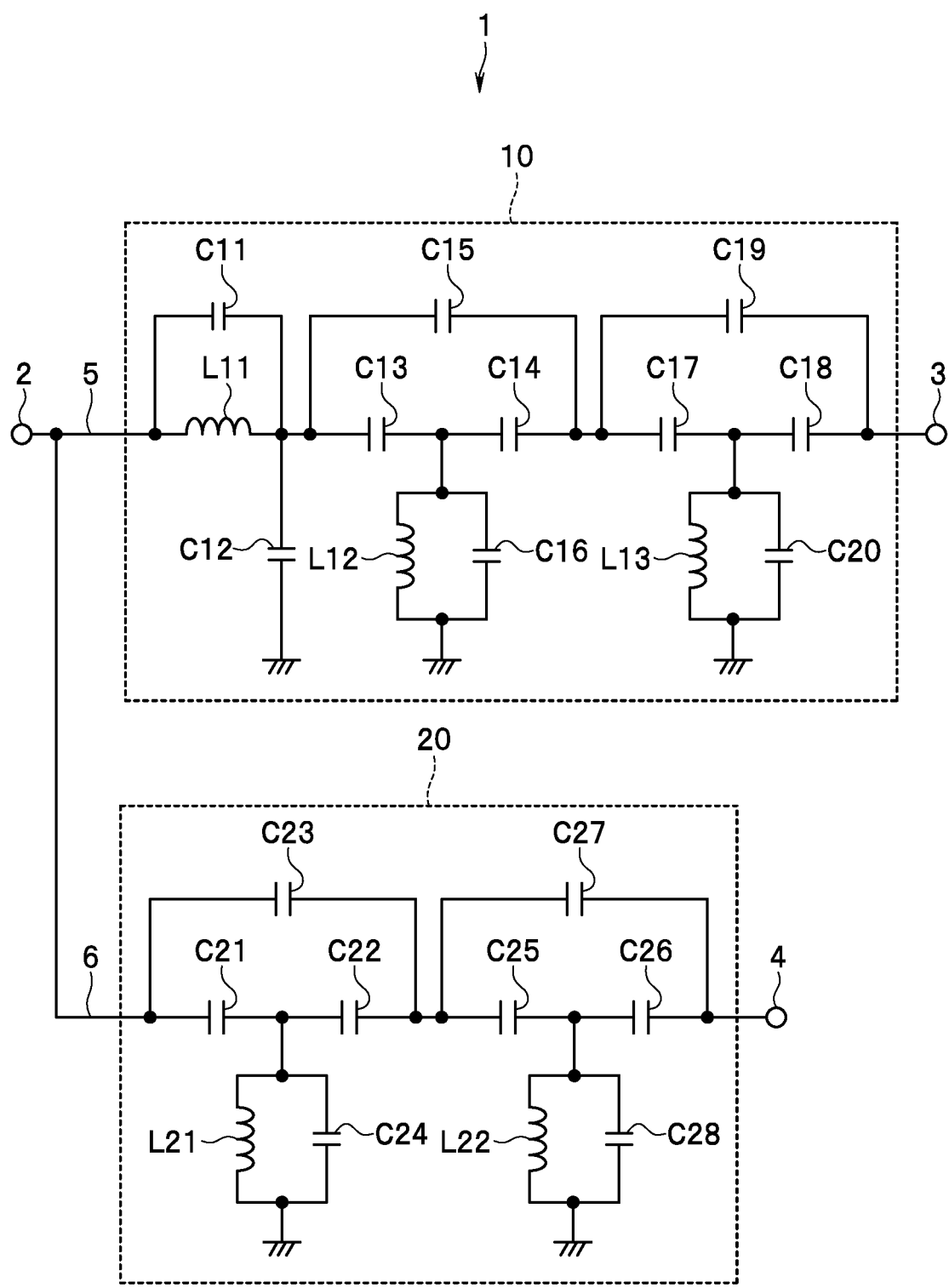
FIG. 1 is a circuit diagram showing a circuit configuration of a multilayer electronic component according to an embodiment of the present invention.

An embodiment of the present invention will now be described in detail with reference to the drawings. First, a configuration of a multilayer electronic component (hereinafter simply referred to as an electronic component) 1 according to the embodiment of the present invention will be outlined with reference to FIG. 1. FIG. 1 shows a branching filter (diplexer) as an example of the electronic component 1. The electronic component 1 includes a first filter 10 that selectively passes a first signal of a frequency within a first passband, and a second filter 20 that selectively passes a second signal of a frequency within a second passband different from the first passband. In the present embodiment, in particular, the second passband is a frequency band higher than the first passband.

The electronic component 1 further includes a common port 2, a first signal port 3, a second signal port 4, a first signal path 5 connecting the common port 2 and the first signal port 3, and a second signal path 6 connecting the common port 2 and the second signal port 4. The first filter 10 is provided between the common port 2 and the first signal port 3 in a circuit configuration. The second filter 20 is provided between the common port 2 and the second signal port 4 in the circuit configuration. Note that, in the present application, the expression of "in the (a) circuit configuration" is used to indicate not layout in physical configuration but layout in the circuit diagram.

The first signal path 5 is a path leading from the common port 2 to the first signal port 3 via the first filter 10. The second signal path 6 is a path leading from the common port 2 to the second signal port 4 via the second filter 20. The first signal of a frequency within the first passband selectively passes through the first signal path 5 on which the first filter 10 is provided. The second signal of a frequency within the second passband selectively passes through the second signal path 6 on which the second filter 20 is provided. In such a manner, the electronic component 1 separates the first signal and the second signal.

Next, an example of configurations of the first and second filters 10 and 20 will be described with reference to FIG. 1. In the example shown in FIG. 1, the first filter 10 is a band-pass filter. The first filter 10 is an LC filter including inductors L11, L12, and L13 and capacitors C11, C12, C13, C14, C15, C16, C17, C18, C19, and C20. One end of the inductor L11 is connected to the common port 2. The capacitor C11 is connected in parallel with the inductor L11. One end of the capacitor C12 is connected to the other end of the inductor L11. The other end of the capacitor C12 is connected to the ground.

One end of the capacitor C13 is connected to the other end of the inductor L11. One end of the capacitor C14 is connected to the other end of the capacitor C13. One end of the capacitor C15 is connected to the one end of the capacitor C13. The other end of the capacitor C15 is connected to the other end of the capacitor C14.

One end of the inductor L12 is connected to a connection point between the capacitor C13 and the capacitor C14. The other end of the inductor L12 is connected to the ground. The capacitor C16 is connected in parallel with the inductor L12.

One end of the capacitor C17 is connected to the other end of the capacitor C14. One end of the capacitor C18 is connected to the other end of the capacitor C17. The other end of the capacitor C18 is connected to the first signal port 3. One end of the capacitor C19 is connected to the one end of the capacitor C17. The other end of the capacitor C19 is connected to the other end of the capacitor C18.

One end of the inductor L13 is connected to a connection point between the capacitor C17 and the capacitor C18. The other end of the inductor L13 is connected to the ground. The capacitor C20 is connected in parallel with the inductor L13.

In the example shown in FIG. 1, the second filter 20 is a high-pass filter. The second filter 20 is an LC filter including inductors L21 and L22 and capacitors C21, C22, C23, C24, C25, C26, C27, and C28. One end of the capacitor C21 is connected to the common port 2. One end of the capacitor C22 is connected to the other end of the capacitor C21. One end of the capacitor C23 is connected to the one end of the capacitor C21. The other end of the capacitor C23 is connected to the other end of the capacitor C22.

One end of the inductor L21 is connected to a connection point between the capacitor C21 and the capacitor C22. The other end of the inductor L21 is connected to the ground. The capacitor C24 is connected in parallel with the inductor L21.

One end of the capacitor C25 is connected to the other end of the capacitor C22. One end of the capacitor C26 is connected to the other end of the capacitor C25. The other end of the capacitor C26 is connected to the second signal port 4. One end of the capacitor C27 is connected to the one end of the capacitor C25. The other end of the capacitor C27 is connected to the other end of the capacitor C26.

One end of the inductor L22 is connected to a connection point between the capacitor C25 and the capacitor C26. The other end of the inductor L22 is connected to the ground. The capacitor C28 is connected in parallel with the inductor L22.

Figure 2:
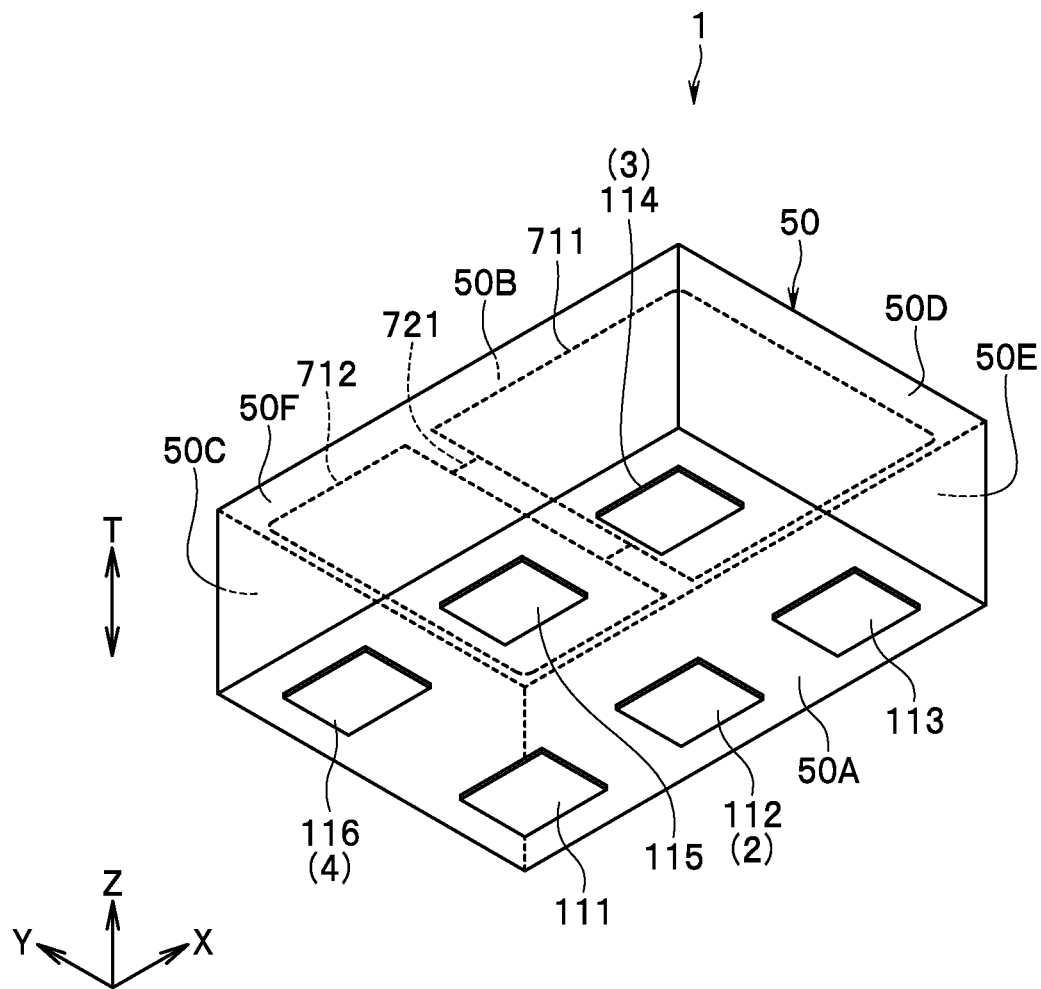
FIG. 2 is a perspective view showing the appearance of the multilayer electronic component according to the embodiment of the present invention.

Next, other configurations of the electronic component 1 will be described with reference to FIG. 2. FIG. 2 is a perspective view showing the appearance of the electronic component 1.

The electronic component 1 further includes a stack 50 including a plurality of dielectric layers and a plurality of conductor layers stacked together. The common port 2, the first signal port 3, the second signal port 4, the first filter 10, and the second filter 20 are integrated with the stack 50.

The stack 50 has a bottom surface 50A and a top surface 50B located at both ends in a stacking direction T of the plurality of dielectric layers, and four side surfaces 50C to 50F connecting the bottom surface 50A and the top surface 50B. The side surfaces 50C and 50D are opposite to each other. The side surfaces 50E and 50F are opposite to each other. The side surfaces 50C to 5° F. are perpendicular to the top surface 50B and the bottom surface 50A.

Here, X, Y, and Z directions are defined as shown in FIG. 2. The X, Y, and Z directions are orthogonal to one another. In the present embodiment, a direction parallel to the stacking direction T will be referred to as the Z direction. The opposite directions to the X, Y, and Z directions are defined as −X, −Y, and −Z directions, respectively.

As shown in FIG. 2, the bottom surface 50A is located at the end of the stack 50 in the −Z direction. The top surface 50B is located at the end of the stack 50 in the Z direction. The bottom surface 50A and the top surface 50B each have a rectangular shape extending in the X direction. The side surface 50C is located at the end of the stack 50 in the —X direction. The side surface 50D is located at the end of the stack 50 in the X direction. The side surface 50E is located at the end of the stack 50 in the —Y direction. The side surface 50F is located at the end of the stack 50 in the Y direction.

The bottom surface 50A faces a mounted body (not shown), such as a substrate. The bottom surface 50A corresponds to the "first surface" in the present invention. In the stack 50, the top surface 50B is located opposite to the bottom surface 50A. The top surface 50B corresponds to the "second surface" in the present invention.

The electronic component 1 further includes terminals 111, 112, 113, 114, 115, and 116 provided on the bottom surface 50A of the stack 50. The terminals 111, 112, and 113 are arranged in this order in the X direction at positions closer to the side surface 50E than the side surface 50F. The terminals 114, 115, and 116 are arranged in this order in the —X direction at positions closer to the side surface 50F than the side surface 50E.

The terminal 112 corresponds to the common port 2, the terminal 114 corresponds to the first signal port 3, and the terminal 116 corresponds to the second signal port 4. The common port 2, the first signal port 3, and the second signal port 4 are thus provided on the bottom surface 50A of the stack 50. Each of the terminals 111, 113, and 115 is connected to the ground.

The electronic component 1 further includes a first ground conductor layer 711 and a second ground conductor layer 712 each integrated with the stack 50 and also connected to the ground. The first ground conductor layer 711 and the second ground conductor layer 712 are each arranged at a position closer to the top surface 50B than the bottom surface 50A. The first ground conductor layer 711 and the second ground conductor layer 712 are separated from each other. The first ground conductor layer 711 is arranged at a position closer to the side surface 50D than the side surface 50C. The second ground conductor layer 712 is arranged at a position closer to the side surface 50C than the side surface 50D.

Next, an example of the plurality of dielectric layers and the plurality of conductor layers constituting the stack 50 will be described with reference to FIG. 3A to FIG. 7. In this example, the stack 50 includes twenty-two dielectric layers stacked together. In the following, the twenty-two dielectric layers will be referred to as the first to twenty-second dielectric layers in the order from bottom to top. The first to twenty-second dielectric layers are denoted by reference numerals 51 to 72, respectively.

In FIG. 3A to FIG. 6B, each of a plurality of circles represents a through hole. The dielectric layers 51 to 70 each have a plurality of through holes. The plurality of through holes are each formed by filling a hole intended for a through hole with a conductive paste. Each of the plurality of through holes is connected to a conductor layer or another through hole.

Figure 3A:
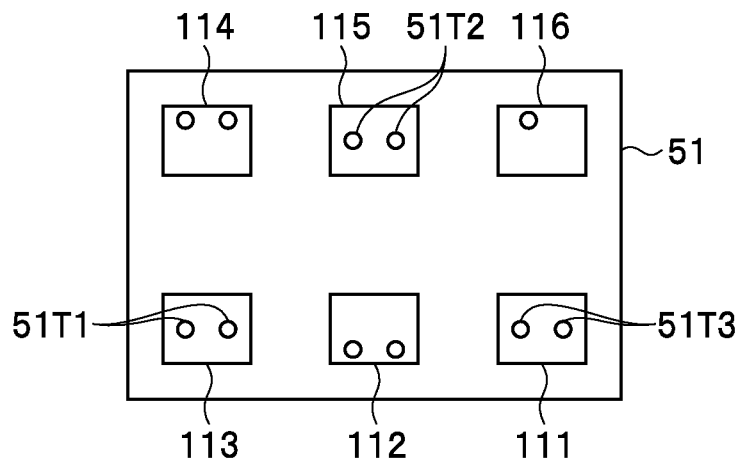
FIG. 3A to FIG. 3C are explanatory diagrams showing respective patterned surfaces of first to third dielectric layers of a stack of the multilayer electronic component according to the embodiment of the present invention.

FIG. 3A shows the patterned surface of the first dielectric layer 51. The terminals 111 to 116 are formed on the patterned surface of the dielectric layer 51. In FIG. 3A, of the plurality of through holes formed in the dielectric layer 51, two specific through holes connected to the terminal 111 are each denoted by a reference numeral 51T3, two specific through holes connected to the terminal 113 are each denoted by a reference numeral 51T1, and two specific through holes connected to the terminal 115 are each denoted by a reference numeral 51T2.

Figure 3B:
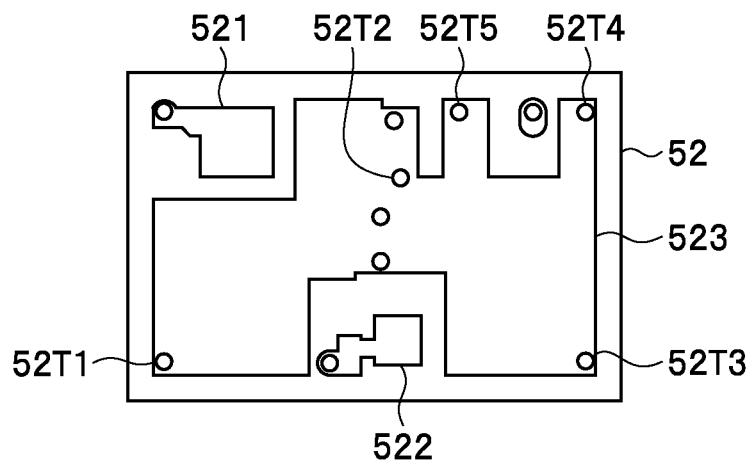

FIG. 3B shows the patterned surface of the second dielectric layer 52. Conductor layers 521, 522, and 523 are formed on the patterned surface of the dielectric layer 52. The through holes 51T1 to 51T3 formed in the dielectric layer 51 are connected to the conductor layer 523. In FIG. 3B, of the plurality of through holes formed in the dielectric layer 52, five specific through holes connected to the conductor layer 523 are denoted by reference numerals 52T1, 52T2, 52T3, 52T4, and 52T5.

Figure 3C:
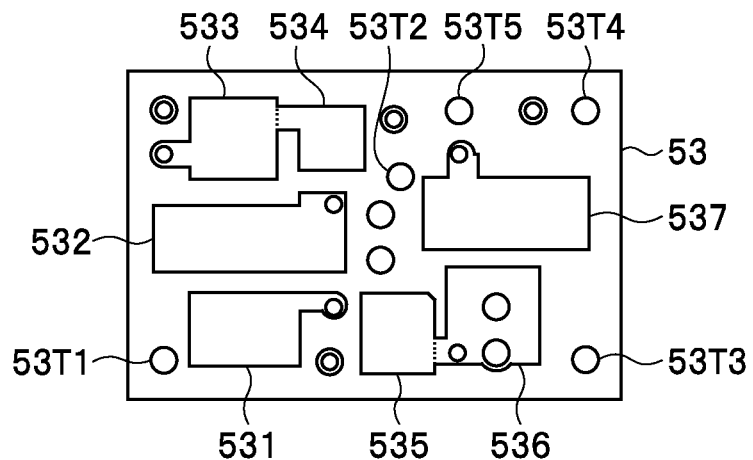

FIG. 3C shows the patterned surface of the third dielectric layer 53. Conductor layers 531, 532, 533, 534, 535, 536, and 537 are formed on the patterned surface of the dielectric layer 53. The conductor layer 533 is connected to the conductor layer 534. The conductor layer 535 is connected to the conductor layer 536. In FIG. 3C, each of the boundary between the conductor layer 533 and the conductor layer 534 and the boundary between the conductor layer 535 and the conductor layer 536 is indicated by a dotted line.

In FIG. 3C, of the plurality of through holes formed in the dielectric layer 53, five specific through holes are denoted by reference numerals 53T1, 53T2, 53T3, 53T4, and 53T5. The through holes 52T1 to 52T5 formed in the dielectric layer 52 are connected to the through holes 53T1 to 53T5, respectively.

Figure 4A:
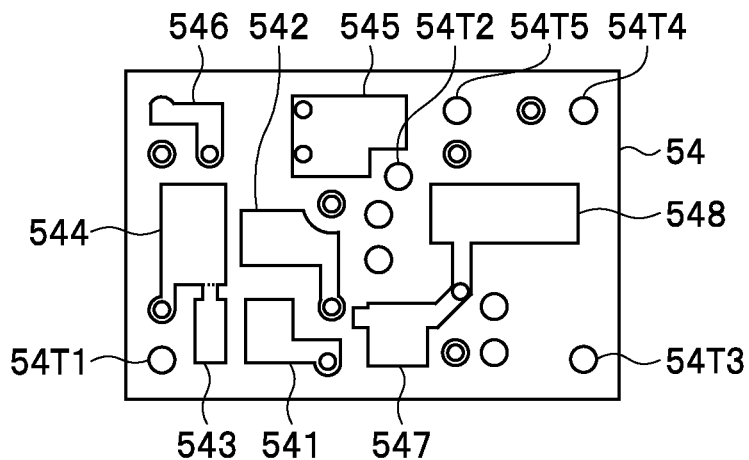
FIG. 4A to FIG. 4C are explanatory diagrams showing respective patterned surfaces of fourth to sixth dielectric layers of the stack of the multilayer electronic component according to the embodiment of the present invention.

FIG. 4A shows the patterned surface of the fourth dielectric layer 54. Conductor layers 541, 542, 543, 544, 545, 546, 547, and 548 are formed on the patterned surface of the dielectric layer 54. The conductor layer 543 is connected to the conductor layer 544. The conductor layer 547 is connected to the conductor layer 548. In FIG. 4A, the boundary between the conductor layer 543 and the conductor layer 544 is indicated by a dotted line.

In FIG. 4A, of the plurality of through holes formed in the dielectric layer 54, five specific through holes are denoted by reference numerals 54T1, 54T2, 54T3, 54T4, and 54T5. The through holes 53T1 to 53T5 formed in the dielectric layer 53 are connected to the through holes 54T1 to 54T5, respectively.

Figure 4B:
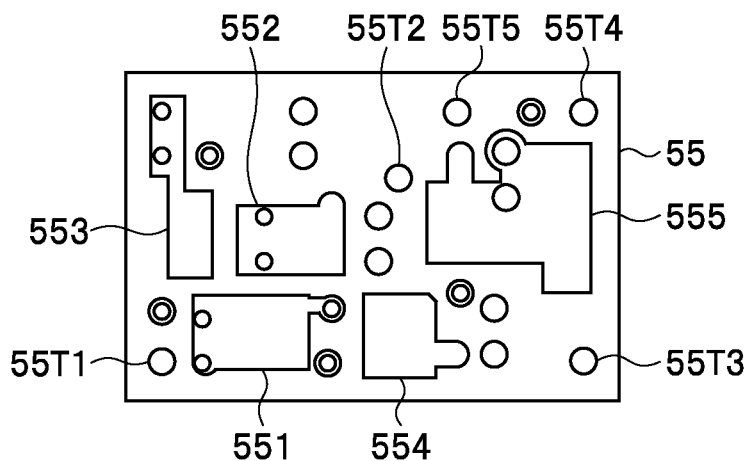

FIG. 4B shows the patterned surface of the fifth dielectric layer 55. Conductor layers 551, 552, 553, 554, and 555 are formed on the patterned surface of the dielectric layer 55. In FIG. 4B, of the plurality of through holes formed in the dielectric layer 55, five specific through holes are denoted by reference numerals 55T1, 55T2, 55T3, 55T4, and 55T5. The through holes 54T1 to 54T5 formed in the dielectric layer 54 are connected to the through holes 55T1 to 55T5, respectively.

Figure 4C:
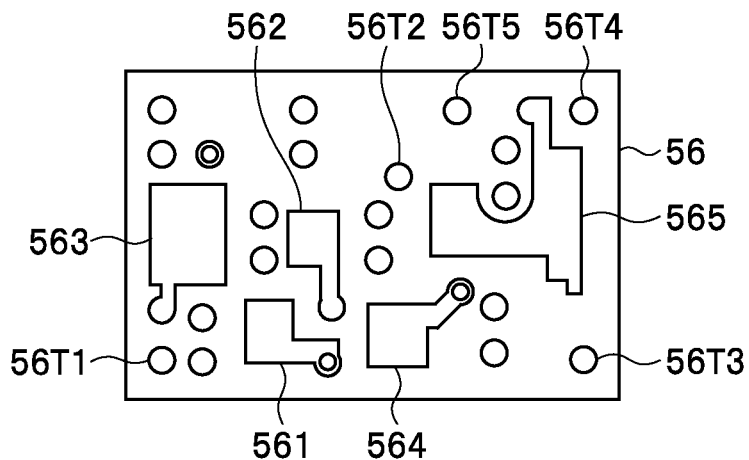

FIG. 4C shows the patterned surface of the sixth dielectric layer 56. Conductor layers 561, 562, 563, 564, and 565 are formed on the patterned surface of the dielectric layer 56. In FIG. 4C, of the plurality of through holes formed in the dielectric layer 56, five specific through holes are denoted by reference numerals 56T1, 56T2, 56T3, 56T4, and 56T5, respectively. The through holes 55T1 to 55T5 formed in the dielectric layer 55 are connected to the through holes 56T1 to 56T5, respectively.

Figure 5A:
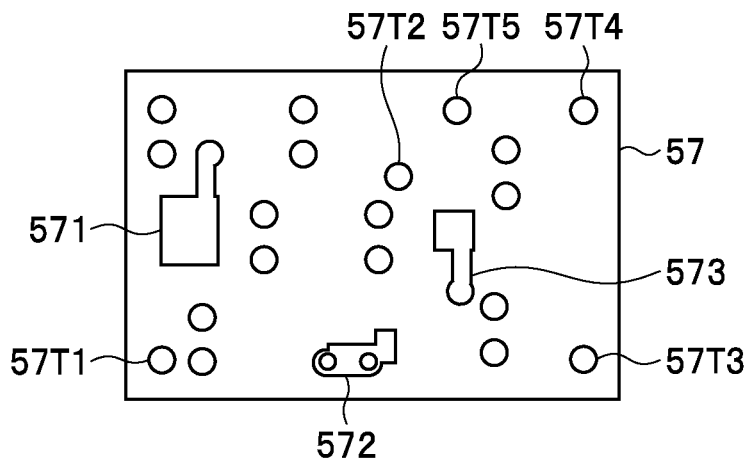
FIG. 5A is an explanatory diagram showing a patterned surface of a seventh dielectric layer of the stack of the multilayer electronic component according to the embodiment of the present invention.

FIG. 5A shows the patterned surface of the seventh dielectric layer 57. Conductor layers 571, 572, and 573 are formed on the patterned surface of the dielectric layer 57. In FIG. 5A, of the plurality of through holes formed in the dielectric layer 57, five specific through holes are denoted by reference numerals 57T1, 57T2, 57T3, 57T4, and 57T5, respectively. The through holes 56T1 to 56T5 formed in the dielectric layer 56 are connected to the through holes 57T1 to 57T5, respectively.

Figure 5B:
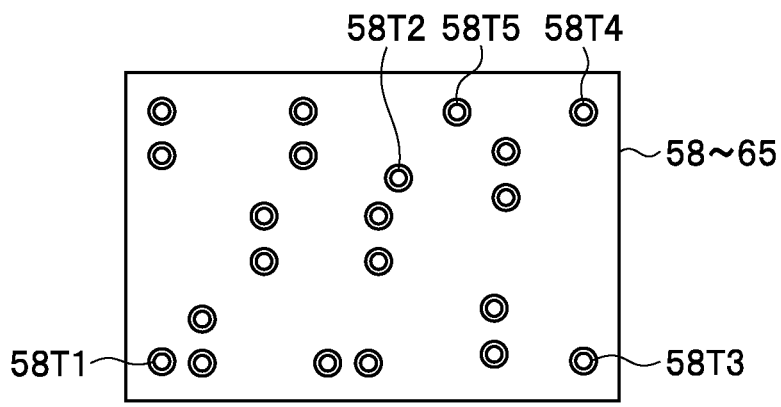
FIG. 5B is an explanatory diagram showing a patterned surface of each of eighth to fifteenth dielectric layers of the stack of the multilayer electronic component according to the embodiment of the present invention.

FIG. 5B shows the patterned surface of each of the eighth to fifteenth dielectric layers 58 to 65. In FIG. 5B, of the plurality of through holes formed in each of the dielectric layers 58 to 65, five specific through holes are denoted by reference numerals 58T1, 58T2, 58T3, 58T4, and 58T5. The through holes 57T1 to 57T5 formed in the dielectric layer 57 are connected to the through holes 58T1 to 58T5 formed in the dielectric layer 58, respectively. In the dielectric layers 58 to 65, every vertically adjacent through holes denoted by the same reference signs are connected to each other.

Figure 5C:
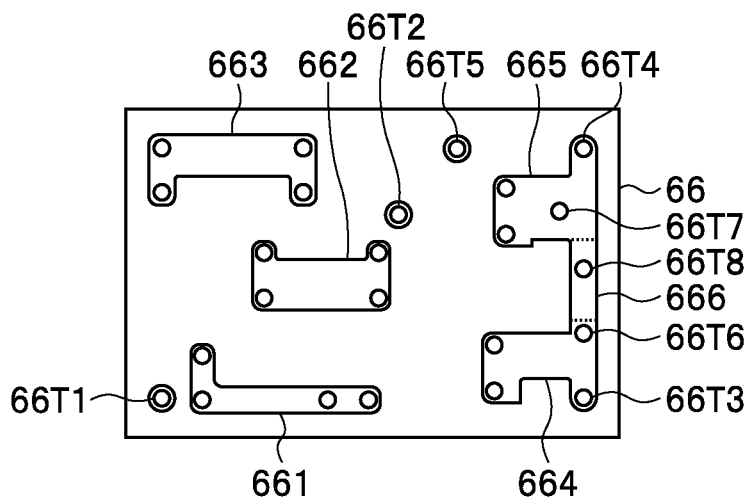
FIG. 5C is an explanatory diagram showing a patterned surface of a sixteenth dielectric layer of the stack of the multilayer electronic component according to the embodiment of the present invention.

FIG. 5C shows the patterned surface of the sixteenth dielectric layer 66. Inductor conductor layers 661, 662, 663, 664, and 665 and a conductor layer 666 are formed on the patterned surface of the dielectric layer 66. The conductor layers 664 and 665 are connected to the conductor layer 666. In FIG. 5C, each of the boundary between the conductor layer 664 and the conductor layer 666 and the boundary between the conductor layer 665 and the conductor layer 666 is indicated by a dotted line.

In FIG. 5C, of the plurality of through holes formed in the dielectric layer 66, eight specific through holes are denoted by reference numerals 66T1, 66T2, 66T3, 66T4, 66T5, 66T6, 66T7, and 66T8, respectively. The through holes 58T1, 58T2, and 58T5 formed in the dielectric layer 65 are connected to the through holes 66T1, 66T2, and 66T5, respectively. The through hole 58T3 formed in the dielectric layer 65 and the through holes 66T3 and 66T6 are connected to the conductor layer 664. The through hole 58T4 formed in the dielectric layer 65 and the through holes 66T4 and 66T7 are connected to the conductor layer 665. The through hole 66T8 is connected to the conductor layer 666.

Figure 6A:
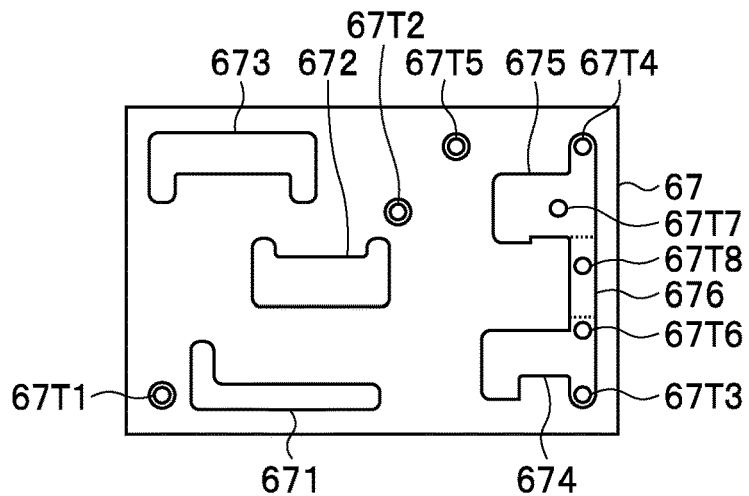
FIG. 6A is an explanatory diagram showing a patterned surface of a seventeenth dielectric layer of the stack of the multilayer electronic component according to the embodiment of the present invention.

FIG. 6A shows the patterned surface of the seventeenth dielectric layer 67. Inductor conductor layers 671, 672, 673, 674, and 675 and the conductor layer 676 are formed on the patterned surface of the dielectric layer 67. The conductor layers 674 and 675 are connected to the conductor layer 676. In FIG. 6A, each of the boundary between the conductor layer 674 and the conductor layer 676 and the boundary between the conductor layer 675 and the conductor layer 676 is indicated by a dotted line.

In FIG. 6A, of the plurality of through holes formed in the dielectric layer 67, eight specific through holes are denoted by reference numerals 67T1, 67T2, 67T3, 67T4, 67T5, 67T6, 67T7, and 67T8, respectively. The through holes 66T1, 66T2, and 66T5 formed in the dielectric layer 66 are connected to the through holes 67T1, 67T2, and 67T5, respectively. The through holes 66T3 and 66T6 formed in the dielectric layer 66 and the through holes 67T3 and 67T6 are connected to the conductor layer 674. The through holes 66T4 and 66T7 formed in the dielectric layer 66 and the through holes 67T4 and 67T7 are connected to the conductor layer 675. The through hole 66T8 formed in the dielectric layer 66 and the through hole 67T8 are connected to the conductor layer 676.

Figure 6B:
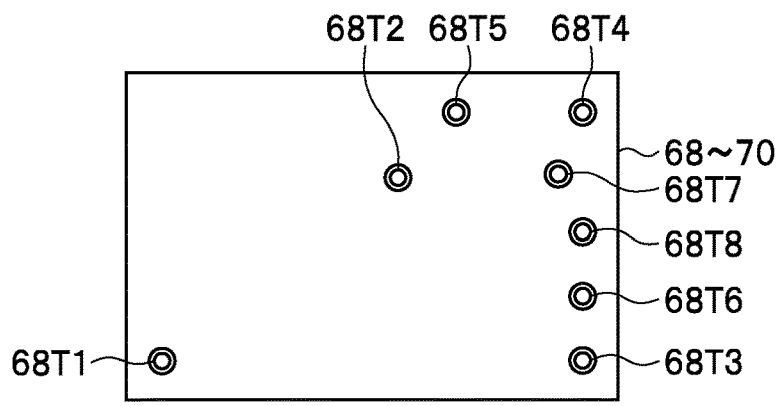
FIG. 6B is an explanatory diagram showing a patterned surface of each of eighteenth to twentieth dielectric layers of the stack of the multilayer electronic component according to the embodiment of the present invention.

FIG. 6B shows the patterned surface of each of the eighteenth to twentieth dielectric layers 68 to 70. In FIG. 6B, of the plurality of through holes formed in the dielectric layers 68 to 70, eight specific through holes are denoted by reference numerals 68T1, 68T2, 68T3, 68T4, 68T5, 68T6, 68T7, and 68T8, respectively. The through holes 67T1 to 67T8 formed in the dielectric layer 67 are connected to the through holes 68T1 to 68T8 formed in the dielectric layer 68, respectively. In the dielectric layers 68 to 70, every vertically adjacent through holes denoted by the same reference signs are connected to each other.

Figure 6C:
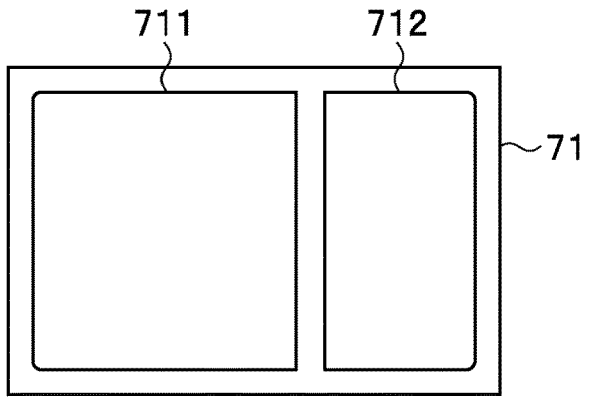
FIG. 6C is an explanatory diagram showing a patterned surface of a twenty-first dielectric layer of the stack of the multilayer electronic component according to the embodiment of the present invention.

FIG. 6C shows the patterned surface of the twenty-first dielectric layer 71. The first ground conductor layer 711 and the second ground conductor layer 712 are formed on the patterned surface of the dielectric layer 71. The through holes 68T1 and 68T2 formed in the dielectric layer 70 are connected to the first ground conductor layer 711. The through holes 68T3 to 68T8 formed in the dielectric layer 70 are connected to the second ground conductor layer 712.

Figure 7:
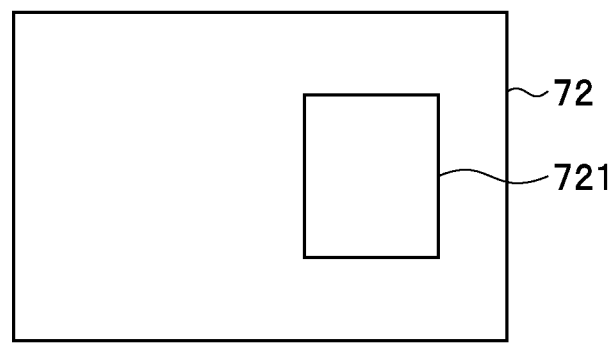
FIG. 7 is an explanatory diagram showing a patterned surface of a twenty-second dielectric layer of the stack of the multilayer electronic component according to the embodiment of the present invention.

FIG. 7 shows the patterned surface of the twenty-second dielectric layer 72. A mark 721 made of a conductor layer is formed on the patterned surface of the dielectric layer 72.

The stack 50 shown in FIG. 2 is formed by stacking the first to twenty-second dielectric layers 51 to 72 such that the patterned surface of the first dielectric layer 51 serves as the bottom surface 50A of the stack 50 and the surface of the twenty-second dielectric layer 72 opposite to the patterned surface thereof serves as the top surface 50B of the stack 50.

Each of the plurality of through holes shown in FIG. 3A to FIG. 5C excluding the above-described plurality of specific through holes is connected to, when the first to twenty-second dielectric layers 51 to 72 are stacked, a conductor layer overlapping in the stacking direction T or to another through hole overlapping in the stacking direction T. Of the plurality of through holes shown in FIGS. 3A to 5C excluding the above-described plurality of specific through holes, the ones located within a terminal or a conductor layer are connected to the terminal or conductor layer.

Figure 8:
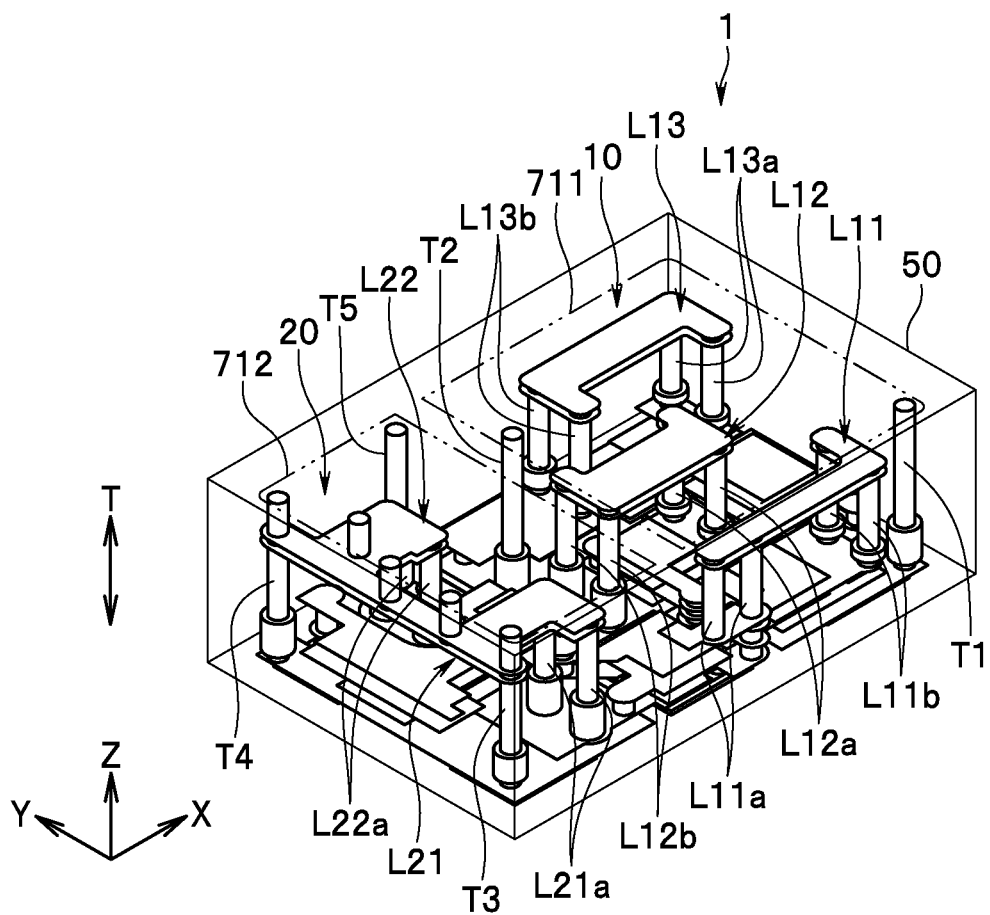
FIG. 8 is a perspective view showing the inside of the stack of the multilayer electronic component according to the embodiment of the present invention.

FIG. 8 shows the inside of the stack 50 formed by stacking the first to twenty-second dielectric layers 51 to 72. As shown in FIG. 8, the plurality of conductor layers and the plurality of through holes shown in FIG. 3A to 6C are stacked inside the stack 50. Note that FIG. 8 omits the mark 721.

Correspondences between the circuit components of the electronic component 1 shown in FIG. 1 and the internal components of the stack 50 shown in FIG. 3A to FIG. 6C will now be described. Components of the first filter 10 will initially be described. The inductor L11 is constituted by the inductor conductor layers 661 and 671 and the plurality of through holes connected to those conductor layers. The inductor L12 is constituted by the inductor conductor layers 662 and 672 and the plurality of through holes connected to those conductor layers. The inductor L13 is constituted by the inductor conductor layers 663 and 673 and the plurality of through holes connected to those conductor layers.

The capacitor C11 is constituted by the conductor layers 531, 541, 551, and 561 and the dielectric layers 53 to 55 interposed between those conductor layers. The capacitor C12 is constituted by the conductor layers 523 and 531 and the dielectric layer 52 interposed between those conductor layers.

The capacitor C13 is constituted by the conductor layers 532, 542, 552, and 562 and the dielectric layers 53 to 55 interposed between those conductor layers. The capacitor C14 is constituted by the conductor layers 532 and 544 and the dielectric layer 53 interposed between those conductor layers. The capacitor C15 is constituted by the conductor layers 543 and 551 and the dielectric layer 54 interposed between those conductor layers. The capacitor C16 is constituted by the conductor layers 523 and 532 and the dielectric layer 52 interposed between those conductor layers.

The capacitor C17 is constituted by the conductor layers 544, 553, and 563 and the dielectric layers 54 and 55 interposed between those conductor layers. The capacitor C18 is constituted by the conductor layers 521 and 533 and the dielectric layer 52 interposed between those conductor layers. The capacitor C19 is constituted by the conductor layers 563 and 571 and the dielectric layer 56 interposed between those conductor layers. The capacitor C20 is constituted by the conductor layers 523, 534, and 545 and the dielectric layers 52 and 53 interposed between those conductor layers.

Next, components of the second filter 20 will be described. The inductor L21 is constituted by the inductor conductor layers 664 and 674 and the plurality of through holes connected to those conductor layers. The inductor L22 is constituted by the inductor conductor layers 665 and 675 and the plurality of through holes connected to those conductor layers.

The capacitor C21 is constituted by the conductor layers 522 and 535 and the dielectric layer 52 interposed between those conductor layers. The capacitor C22 is constituted by the conductor layers 535, 547, 554, and 564 and the dielectric layers 53 to 55 interposed between those conductor layers. The capacitor C23 is constituted by the conductor layers 564 and 572 and the dielectric layer 56 interposed between those conductor layers. The capacitor C24 is constituted by the conductor layers 523 and 536 and the dielectric layer 52 interposed between those conductor layers.

The capacitor C25 is constituted by the conductor layers 548 and 555 and the dielectric layer 54 interposed between those conductor layers. The capacitor C26 is constituted by the conductor layers 555 and 565 and the dielectric layer 55 interposed between those conductor layers. The capacitor C27 is constituted by the conductor layers 565 and 573 and the dielectric layer 56 interposed between those conductor layers. The capacitor C28 is constituted by the conductor layers 523 and 537 and the dielectric layer 52 interposed between those conductor layers.

Figure 9:
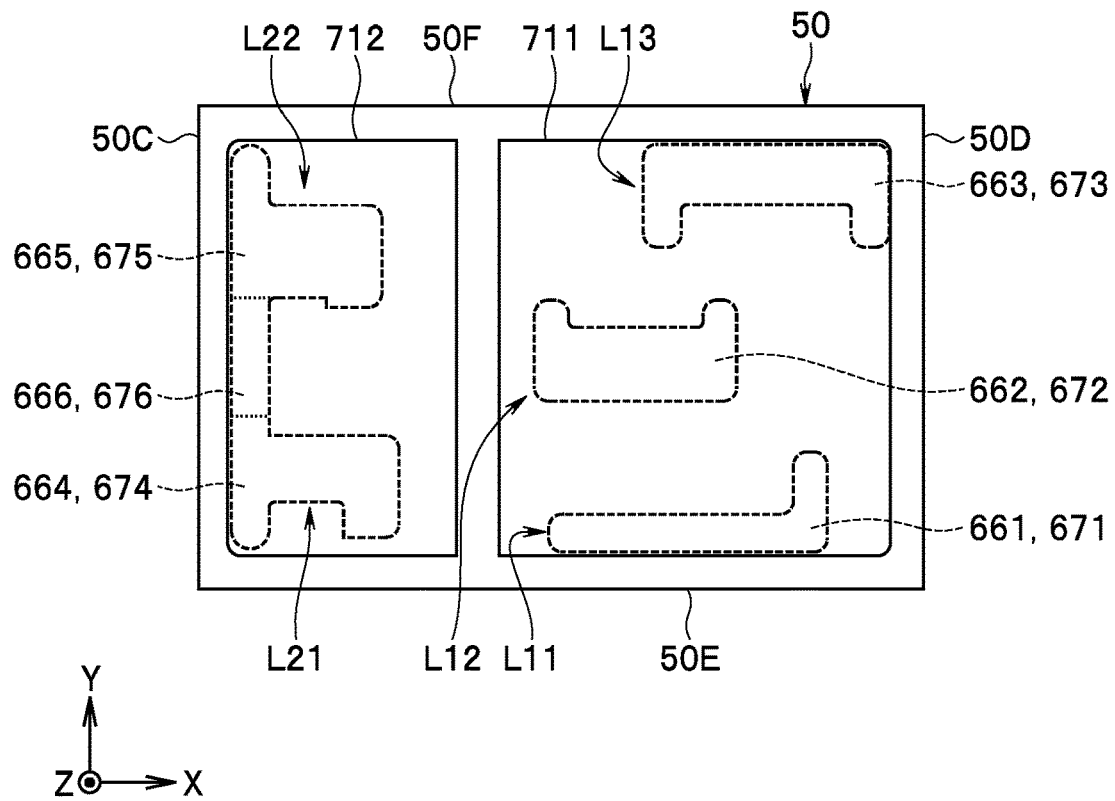
FIG. 9 is a plan view showing a part of an inside of the stack of the multilayer electronic component according to the embodiment of the present invention.
Figure 10:
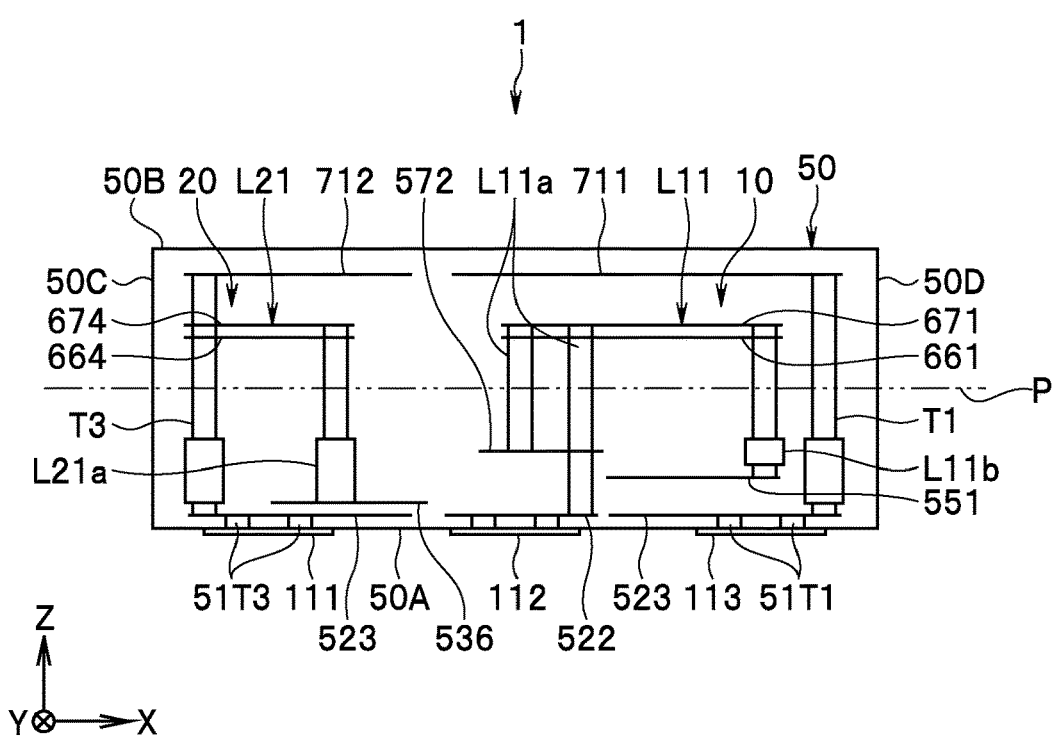
FIG. 10 is a side view showing a part of the inside of the stack of the multilayer electronic component according to the embodiment of the present invention.
Figure 11:
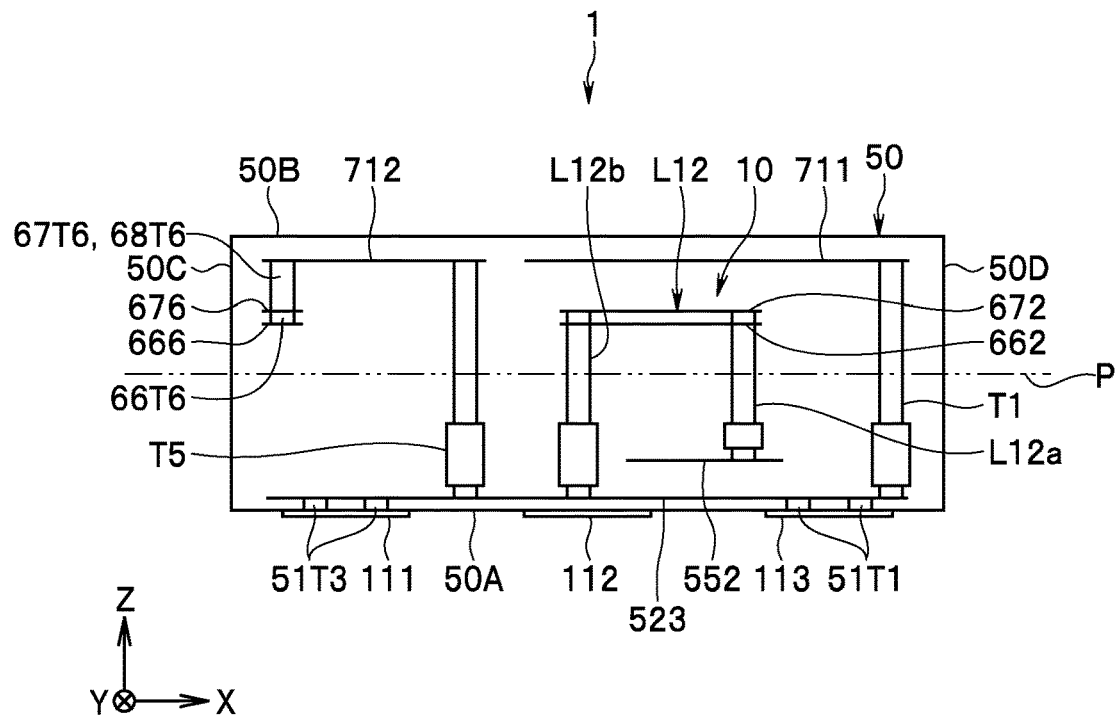
FIG. 11 is a side view showing a part of the inside of the stack of the multilayer electronic component according to the embodiment of the present invention.
Figure 12:
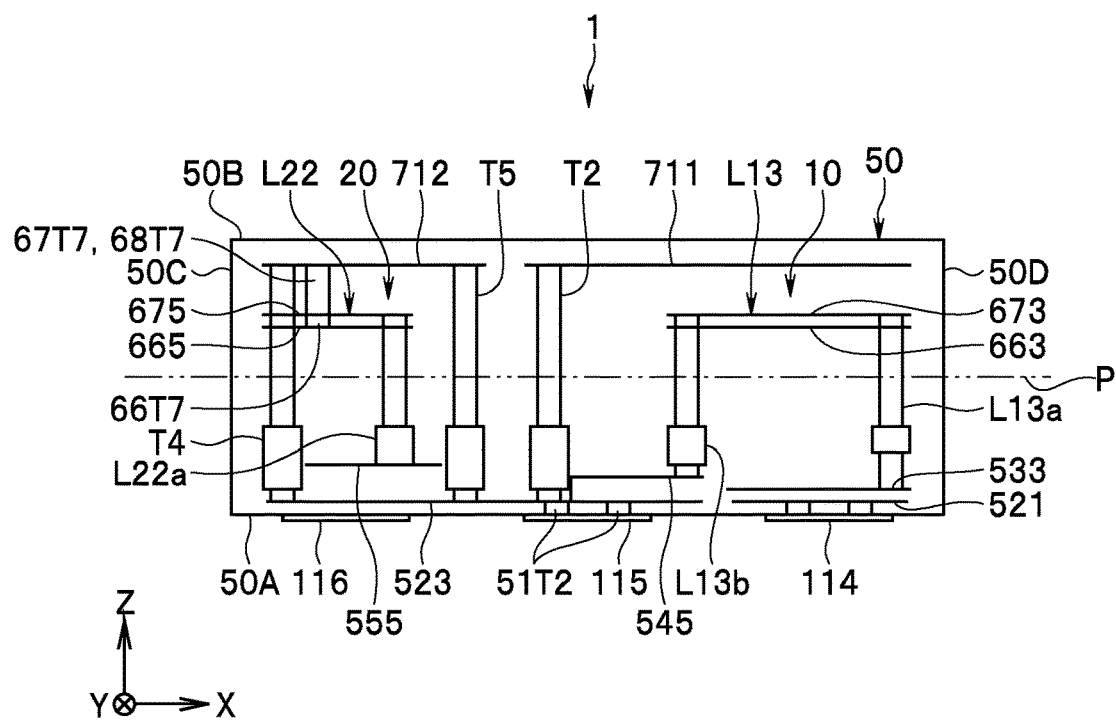
FIG. 12 is a side view showing a part of the inside of the stack of the multilayer electronic component according to the embodiment of the present invention.

Next, structural features of the electronic component 1 according to the present embodiment will be described with reference to FIGS. 2 to 12. FIG. 9 is a plan view showing a part of the inside of the stack 50 seen from the top surface 50B side. FIG. 10 to FIG. 12 are each a side view showing a part of the inside of the stack 50 seen from the side surface 50E side. FIG. 10 to FIG. 12 show the first and second ground conductor layers 711 and 712. FIG. 10 further shows the inductor L11 of the first filter 10, the inductor L21 of the second filter 20, and the terminals 111 to 113. FIG. 11 further shows the inductor L12 of the first filter 10 and the terminals 111 to 113. FIG. 12 further shows the inductor L13 of the first filter 10, the inductor L22 of the second filter 20, and the terminals 114 to 116.

First, relationships between the first and second filters 10 and 20 and the first and second ground conductor layers 711 and 712 will be described. As shown in FIG. 10 to FIG. 12, the first filter 10 and the second filter 20 are arranged in a longitudinal direction of the bottom surface 50A or the top surface 50B, i.e., a direction parallel to the X direction. The first filter 10 is arranged at a position closer to the side surface 50D than the side surface 50C. The second filter 20 is arranged at a position closer to the side surface 50C than the side surface 50D.

As shown in FIG. 8 and FIG. 10 to FIG. 12, the first filter 10 is arranged between the bottom surface 50A and the first ground conductor layer 711 in the stack 50. No part of the first filter 10 is located between the top surface 50B and the first ground conductor layer 711.

As shown in FIG. 8 and FIG. 10 to FIG. 12, the second filter 20 is arranged between the bottom surface 50A and the second ground conductor layer 712 in the stack 50. No part of the second filter 20 is located between the top surface 50B and the second ground conductor layer 712.

As shown in FIG. 3A, FIG. 3B, and FIG. 10 to FIG. 12, the conductor layer 523 is electrically connected to the terminal 113 via the through hole 51T1, electrically connected to the terminal 115 via the through hole 51T2, and electrically connected to the terminal 111 via the through hole 51T3. The terminals 111, 113, and 115 are all connected to the ground. The conductor layer 523 is hence connected to the ground. The conductor layer 523 is also referred to as a third ground conductor layer 523 below. The third ground conductor layer 523 is arranged at a position closer to the bottom surface 50A than the top surface 50B in the stack 50.

The first ground conductor layer 711 is electrically connected to the third ground conductor layer 523 via the through holes 53T1, 53T2, 54T1, 54T2, 55T1, 55T2, 56T1, 56T2, 57T1, 57T2, 58T1, 58T2, 66T1, 66T2, 67T1, 67T2, 68T1, and 68T2. These through holes correspond to the "plurality of first through holes" in the present invention.

Here, a structure constituted by connecting two or more through holes in series is referred to as a through hole line. The stack 50 includes a through hole line T1 constituted by the through holes 53T1, 54T1, 55T1, 56T1, 57T1, 58T1, 66T1, 67T1, and 68T1 and a through hole line T2 constituted by the through holes 53T2, 54T2, 55T2, 56T2, 57T2, 58T2, 66T2, 67T2, and 68T2. As shown in FIG. 10 to FIG. 12, the first ground conductor layer 711 is electrically connected to the third ground conductor layer 523 via the through hole lines T1 and T2.

The second ground conductor layer 712 is electrically connected to the third ground conductor layer 523 via the through holes 53T3, 53T4, 53T5, 54T3, 54T4, 54T5, 55T3, 55T4, 55T5, 56T3, 56T4, 56T5, 57T3, 57T4, 57T5, 58T3, 58T4, 58T5, 66T3, 66T4, 66T5, 67T3, 67T4, 67T5, 68T3, 68T4, and 68T5. These through holes correspond to the "plurality of second through holes" in the present invention.

The stack 50 further includes a through hole line T3 constituted by the through holes 53T3, 54T3, 55T3, 56T3, 57T3, 58T3, 66T3, 67T3, and 68T3, a through hole line T4 constituted by the through holes 53T4, 54T4, 55T4, 56T4, 57T4, 58T4, 66T4, 67T4, and 68T4, and a through hole line T5 constituted by the through holes 53T5, 54T5, 55T5, 56T5, 57T5, 58T5, 66T5, 67T5, and 68T5. As shown in FIG. 10 to FIG. 12, the second ground conductor layer 712 is electrically connected to the third ground conductor layer 523 via the through hole lines T3, T4, and T5.

The first ground conductor layer 711 and the second ground conductor layer 712 are both electrically connected to the third ground conductor layer 523. The first ground conductor layer 711 and the second ground conductor layer 712 are hence electrically connected to each other via the third ground conductor layer 523. The first ground conductor layer 711 and the second ground conductor layer 712 are each electrically connected to the terminals 111, 113, and 115 via the third ground conductor layer 523 and the through holes 51T1, 51T2, and 51T3.

A plurality of components of the first and second filters 10 and 20 excluding the conductor layers 521 and 522 are arranged between the first and second ground conductor layers 711 and 712 and the third ground conductor layer 523.

Next, a relationship between the first filter 10 and the first ground conductor layer 711 will be described in more detail. The inductors L11 to L13 of the first filter 10 are each wound about an axis that is orthogonal to the stacking direction T and extends in a direction parallel to the Y direction. The stack 50 further includes two through hole lines L11a, two through hole lines L11b, two through hole lines L12a, two through hole lines L12b, two through hole lines L13a, and two through hole lines L13b.

The inductor conductor layer 661 connects respective one ends of the two through hole lines L11a and respective one ends of the two through hole lines L11b. The inductor conductor layer 662 connects respective one ends of the two through hole lines L12a and respective one ends of the two through hole lines L12b. The inductor conductor layer 663 connects respective one ends of the two through hole lines L13a and respective one ends of the two through hole lines L13b.

The inductor L11 is constituted by the inductor conductor layers 661 and 671, the two through hole lines L11a, the two through hole lines L11b, and the four through holes connected to both of the inductor conductor layers 661 and 671. The inductor L12 is constituted by the inductor conductor layers 662 and 672, the two through hole lines L12a, the two through hole lines L12b, and the four through holes connected to both of the inductor conductor layers 662 and 672. The inductor L13 is constituted by the inductor conductor layers 663 and 664, the two through hole lines L13a, the two through hole lines L13b, and the four through holes connected to both of the inductor conductor layers 663 and 673.

As shown in FIG. 9 to FIG. 12, the first ground conductor layer 711 overlaps the inductors L11 to L13 when seen from a direction (for example, the Z direction) parallel to the stacking direction T. Specifically, the first ground conductor layer 711 overlaps the inductor conductor layers 661 to 663 and 671 to 673 and the through hole lines L11a, L11b, L12a, L12b, L13a, and L13b when seen from the direction parallel to the stacking direction T. In the present embodiment, in particular, the first ground conductor layer 711 overlaps the whole of the inductors L11 and L13.

In FIG. 10 to FIG. 12, a reference sign P denotes a virtual plane intersecting the middle of the stacking direction T in the stack 50. The first ground conductor layer 711 overlaps a plurality of components of the first filter 10 located on the top surface 50B side with respect to the virtual plane P (middle of the stacking direction T) when seen from a direction parallel to the stacking direction T. Specifically, the first ground conductor layer 711 overlaps the inductor conductor layers 661 to 663 and 671 to 673 and part of each of the through hole lines L11a, L11b, L12a, L12b, L13a, and L13b when seen from the direction parallel to the stacking direction T. In the present embodiment, in particular, the first ground conductor layer 711 overlaps the whole of the above-described plurality of components.

The first ground conductor layer 711 may overlap the whole of a plurality of components of the first filter 10 located on the bottom surface 50A side with respect to the virtual plane P when seen from a direction parallel to the stacking direction T. Alternatively, the first ground conductor layer 711 may overlap most of the plurality of components of the first filter 10 located on the bottom surface 50A side with respect to the virtual plane P when seen from the direction parallel to the stacking direction T.

Next, a relationship between the second filter 20 and the second ground conductor layer 712 will be described in more detail. The inductors L21 and L22 of the second filter 20 are each wound about an axis that is orthogonal to the stacking direction T and extends in a direction parallel to the Y direction. The stack 50 further includes two through hole lines L21a and two through hole lines L22a.

The inductor conductor layer 664 connects respective one ends of the two through hole lines L21a and the through hole line T3. The inductor conductor layer 665 connects respective one ends of the two through hole lines L22a and the through hole line T4.

The inductor L21 is constituted by the inductor conductor layers 664 and 674, the two through hole lines L21a, and the four through holes connected to both of the inductor conductor layers 664 and 674. The inductor L22 is constituted by the inductor conductor layers 665 and 675, the two through hole lines L22a, and the four through holes connected to both of the inductor conductor layers 662 and 672.

As shown in FIG. 9 to FIG. 12, the second ground conductor layer 712 overlaps the inductors L21 and L22 when seen from a direction (for example, the Z direction) parallel to the stacking direction T. Specifically, the second ground conductor layer 712 overlaps the inductor conductor layers 664, 665, 674, and 675 and the through hole lines L21a and L22a when seen from the direction parallel to the stacking direction T. In the present embodiment, in particular, the second ground conductor layer 712 overlaps the whole of the inductors L21 and L22.

The second ground conductor layer 712 overlaps a plurality of components of the second filter 20 located on the top surface 50B side with respect to the virtual plane P (middle of the stacking direction T) when seen from a direction parallel to the stacking direction T. Specifically, the second ground conductor layer 712 overlaps the inductor conductor layers 664, 665, 674, and 675 and part of each of the through hole lines L21a and L22a when seen from the direction parallel to the stacking direction T. In the present embodiment, in particular, the second ground conductor layer 712 overlaps the whole of the above-described plurality of components.

The second ground conductor layer 712 may overlap the whole of a plurality of components of the second filter 20 located on the bottom surface 50A side with respect to the virtual plane P when seen from a direction parallel to the stacking direction T. Alternatively, the second ground conductor layer 712 may overlap most of the plurality of components of the second filter 20 located on the bottom surface 50A side with respect to the virtual plane P when seen from the direction parallel to the stacking direction T.

The inductor conductor layer 674 constituting the inductor L21 is electrically connected to the second ground conductor layer 712 via the through holes 67T3 and 68T3 constituting part of the through hole line T3 and the through holes 67T6 and 68T6. The inductor conductor layer 675 constituting the inductor L22 is electrically connected to the second ground conductor layer 712 via the through holes 67T4 and 68T4 constituting part of the through hole line T4 and the through holes 67T7 and 68T7. The conductor layer 675 is electrically connected to the second ground conductor layer 712 via the through holes 67T8 and 68T8.

Next, the operation and effects of the electronic component 1 according to the present embodiment will be described. The electronic component 1 includes the first and second ground conductor layers 711 and 712, the first filter 10 that is arranged between the bottom surface 50A and the first ground conductor layer 711 in the stack 50, and the second filter 20 that is arranged between the bottom surface 50A and the second ground conductor layer 712 in the stack 50. In other words, in the present embodiment, the first filter 10 is covered by the first ground conductor layer 711 while the second filter 20 is covered by the second ground conductor layer 712. With this configuration, according to the present embodiment, it is possible to suppress electromagnetic interference between the first and second filters 10 and 20 and other electronic components and consequently to prevent the occurrence of electromagnetic malfunctions due to high density packaging.

In the present embodiment, the first and second filters 10 and 20 are separately covered by the first and second ground conductor layers 711 and 712. With this configuration, according to the present embodiment, it is possible to suppress deterioration of isolation between the first filter 10 and the second filter 20. This effect will be described in detail below with reference to simulation results.

The simulation used a model of a practical example and a model of a comparative example. The model of the practical example is a model of the electronic component 1 according to the present embodiment. The model of the comparative example is a model of an electronic component according to the comparative embodiment. The electronic component of the comparative example basically has the same configuration as that of the electronic component 1 according to the present embodiment excluding the first and second ground conductor layers 711 and 712. The electronic component of the comparative example includes one ground conductor layer instead of the first and second ground conductor layers 711 and 712 of the present embodiment. The first and second filters 10 and 20 are thus covered by one ground conductor layer in the electronic component of the comparative example.

In the simulation, the model of the practical example and the model of the comparative example were designed such that the passband of the first filter 10 (band-pass filter) would be 6.2 GHz to 6.8 GHz and the passband of the second filter 20 (high-pass filter) would be 7.7 GHz or higher in each of the model of the practical example and the model of the comparative example. Note that the shapes and arrangement of the plurality of the conductor layers and the number and arrangement of the plurality of through holes were adjusted in the model of the comparative example so as to match the characteristics of the model of the comparative example to the characteristics of the model of the practical example. Then, in the simulation, the frequency characteristics of isolation between the first filter 10 and the second filter 20 were obtained for each of the model of the practical model and the model of the comparative model. Note that a definition of isolation in the simulation is as follows. Assumed that a power of a signal output from the second signal port 4 when a high-frequency signal of a power P1 is input to the first signal port 3 is P2. Isolation I is defined by Equation (1) below.

$$I = 10 \log(P2/P1) \quad (1)$$

Figure 13:
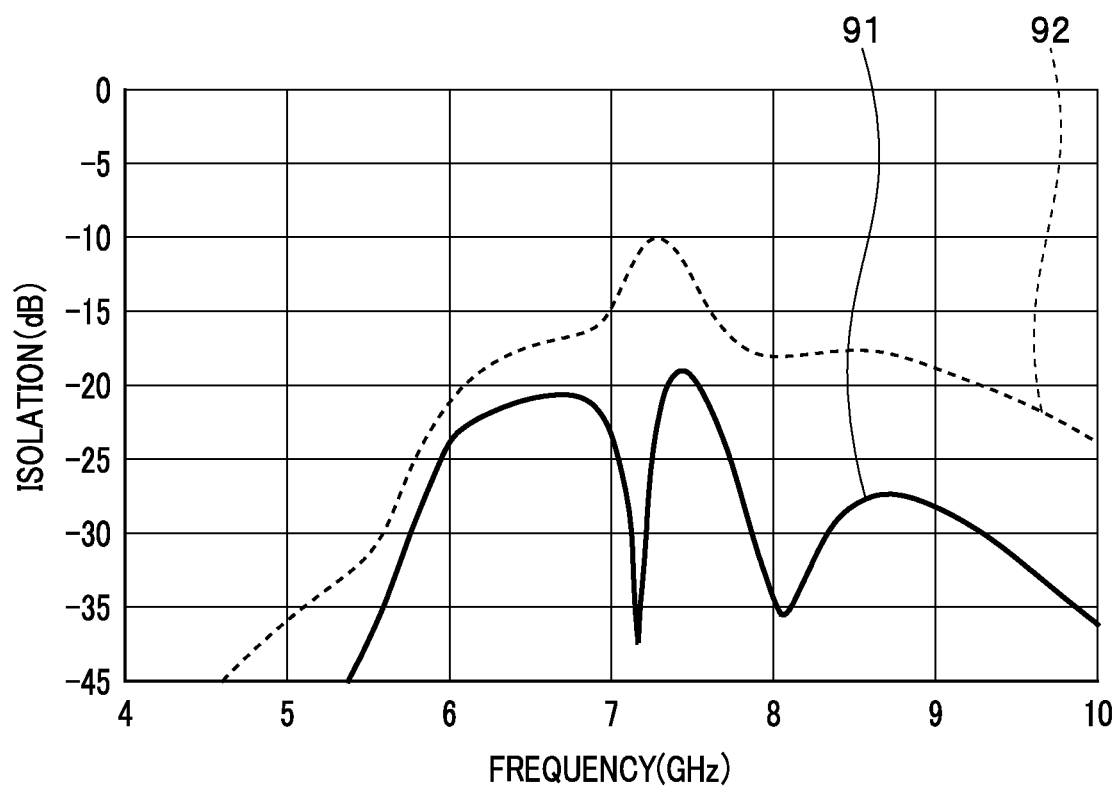
FIG. 13 is a characteristic chart showing isolation characteristics of a model of a practical example and a model of a comparative example.

FIG. 13 is a characteristic chart showing frequency characteristics of isolation. In FIG. 13, the horizontal axis represents frequency, and the vertical axis represents isolation. In FIG. 13, the curve denoted by a reference numeral 91 represents characteristics of the model of the practical example, and the curve denoted by a reference numeral 92 represents characteristics of the model of the comparative example. As shown in FIG. 13, the absolute value of the isolation is large in the model (91) of the practical compared to that of the model (92) of the comparative example.

In the model of the comparative example, the ground conductor layer is connected to a ground pattern of a mounted body, such as a substrate, via a plurality of through holes and a plurality of terminals. Since wirings (through holes) that connect the mounted body and the ground conductor layer are normally thinner than the ground conductor layer and the terminals, an increase in length of these wirings causes the function of the ground conductor layer as the ground to be weaker.

In the model of the comparative example, it is considered that the first and second filters 10 and 20 were each electromagnetically coupled with the ground conductor layer. It is considered that the first filter 10 and the second filter 20 were consequently coupled with each other via the ground conductor layer to thereby cause the absolute value of the isolation to be small.

In contrast to this, in the present embodiment, the first and second filters 10 and 20 are separately covered by the first and second ground conductor layers 711 and 712. With this configuration, according to the present embodiment, it is possible to prevent coupling between the first filter 10 and the second filter 20 attributable to the first and second ground conductor layers 711 and 712. As a result of this, according to the present embodiment, it is possible to achieve sufficiently high isolation between the first filter 10 and the second filter 20.

As described above, according to the present embodiment, it is possible to suppress degradation of isolation between the first filter 10 and the second filter 20 while preventing the occurrence of electromagnetic malfunctions due to high density packaging.

The present invention is not limited to the foregoing embodiment, and various modifications may be made thereto. For example, the electronic component of the present invention may be a branching filter that includes three or more filters to separate three or more signals. In this branching filter, the three or more filters are separately covered by three or more ground conductor layers.

As long as the characteristics are satisfied, the first ground conductor layer 711 need not necessarily cover the whole of the inductors L11 to L13, and the second ground conductor layer 712 need not necessarily cover the whole of the inductors L21 and L22.

Obviously, many modifications and variations of the present invention are possible in the light of the above teachings. Thus, the present invention may be practiced in other embodiments than the foregoing most preferable embodiments within the scope of the appended claims and equivalents thereof

What is claimed is:

1. A multilayer electronic component comprising:
   a stack that includes a plurality of dielectric layers stacked together and includes a first surface facing a mounted body, which is a substrate, and a second surface opposite to the first surface;
   a first ground conductor layer and a second ground conductor layer that are each integrated with the stack and connected to ground;
   a first filter that is arranged between the first surface and the first ground conductor layer in the stack;
   a second filter that is arranged between the first surface and the second ground conductor layer in the stack,
   a plurality of first through holes that electrically connect the first ground conductor layer and the ground; and
   a plurality of second through holes that electrically connect the second ground conductor layer and the ground,
   wherein the first ground conductor layer and the second ground conductor layer are arranged in a direction orthogonal to a stacking direction of the plurality of dielectric layers, when seen from a direction parallel to the stacking direction.

2. The multilayer electronic component according to claim 1, wherein the first ground conductor layer and the second ground conductor layer are arranged at positions closer to the second surface than the first surface in the stack.

3. The multilayer electronic component according to claim 1, wherein the first ground conductor layer and the second ground conductor layer are separated from each other.

4. The multilayer electronic component according to claim 1, wherein
   the first filter selectively passes a signal of a frequency within a first passband, and
   the second filter selectively passes a signal of a frequency within a second passband different from the first passband.

5. The multilayer electronic component according to claim 1, further comprising
   a third ground conductor layer that is arranged at a position closer to the first surface than the second surface in the stack and connected to the ground, wherein
   the first ground conductor layer and the second ground conductor layer are electrically connected to each other through the third ground conductor layer.

6. The multilayer electronic component according to claim 1, further comprising
   a terminal that is arranged on the first surface and connected to the ground, wherein
   the first ground conductor layer and the second ground conductor layer are each electrically connected to the terminal.

7. The multilayer electronic component according to claim 1, wherein
   the first ground conductor layer overlaps a plurality of components of the first filter that are located on a side of the second surface with respect to a middle of the stacking direction in the stack, when seen from the direction parallel to the stacking direction, and
   the second ground conductor layer overlaps a plurality of components of the second filter that are located on the side of the second surface with respect to the middle of the stacking direction in the stack, when seen from the direction parallel to the stacking direction.

8. The multilayer electronic component according to claim 1, wherein
   the first filter and the second filter are each an LC filter constituted by using at least one inductor and at least one capacitor,
   the first ground conductor layer overlaps the at least one inductor constituting the first filter, when seen from the direction parallel to the stacking direction, and
   the second ground conductor layer overlaps the at least one inductor constituting the second filter, when seen from the direction parallel to the stacking direction.

* * * * *